US008477513B2

(12) United States Patent
Politsky et al.

(10) Patent No.: US 8,477,513 B2
(45) Date of Patent: Jul. 2, 2013

(54) ELECTRICAL CONNECTOR SHIELD

(75) Inventors: Peter M. Politsky, Warren, OH (US); Dominic Anthony Messuri, Canfield, OH (US); Michael W. Allender, Austintown, OH (US)

(73) Assignee: Delphi Technologies, Inc., Troy, MI (US)

( * ) Notice: Subject to any disclaimer, the term of this patent is extended or adjusted under 35 U.S.C. 154(b) by 186 days.

(21) Appl. No.: 13/071,961

(22) Filed: Mar. 25, 2011

(65) Prior Publication Data

US 2012/0244751 A1 Sep. 27, 2012

(51) Int. Cl.
*H05K 9/00* (2006.01)
*H01R 13/648* (2006.01)

(52) U.S. Cl.
USPC ....................... 361/816; 361/818; 439/607.35

(58) Field of Classification Search
USPC ....... 361/816, 818, 800; 174/382; 439/607.35
See application file for complete search history.

(56) References Cited

U.S. PATENT DOCUMENTS

| | | | | |
|---|---|---|---|---|
| 5,188,546 | A * | 2/1993 | Ballard et al. | 439/885 |
| 6,524,134 | B2 * | 2/2003 | Flickinger et al. | 439/607.2 |
| 7,795,543 | B2 * | 9/2010 | Krohn et al. | 174/382 |
| 7,889,503 | B2 * | 2/2011 | Nagareda et al. | 361/719 |
| 8,149,594 | B2 * | 4/2012 | Nishihata | 361/818 |

* cited by examiner

*Primary Examiner* — Hlen Vu
(74) *Attorney, Agent, or Firm* — Thomas N. Twomey

(57) ABSTRACT

A connector includes an electromagnetic shield formed of conductive material with at least two depending, conductive, reinforcement sidewalls that each have a plurality of conductive depending sidewall legs distributed about a periphery of the shield and extending upwardly. The shield includes at least one conductive ground tab extending from an edge such that the shield provides a ground path directly from a circuit board to a connector housing. The shield defines at least one opening for receiving an alignment post and at least one additional rectangular opening to permit access to an electrical terminal positioned below the sheet. The rectangular opening may be aligned with terminals positioned within connector housing.

9 Claims, 4 Drawing Sheets

ELECTRICAL CONNECTOR SHIELD

BACKGROUND OF THE INVENTION

The present application relates to electrical connectors and more specifically to a grounded shield for protecting an electrical connector and its associated components from electromagnetic interference.

Electromagnetic shielding can be useful for preventing electromagnetic fields from interfering with the proper functioning of electronic components such as those mounted on or coupled to a printed circuit board. Shielding can be accomplished by surrounding electronic components with a metal cover and conductively coupling the metal cover to a ground. In some applications, a one-piece cover of sheet metal is soldered in place over the circuit board or other protected components such that the shield is electrically coupled to a ground, and the shield is rigidly positioned so as to shield the protected electronic components. Typically, a shield includes a number of tabs that extend through holes in the printed circuit board or other structure that houses the electronic components. The holes may provide an interference fit for simple coupling to a conductive ground structure or may be sized to accommodate formation of a solder connection to the ground. That ground may comprise a conductive trace on the circuit board or may be another metallic structure such as a connector housing. In some applications, multiple shields may be employed.

In an electrical connector assembly, a set of insulated conductors may be contained within a housing and positioned for coupling with a mating set of conductors housed within a mating housing. A printed circuit board may also be contained within one or more of the housings and configured for direct connection the mating set of conductors. In such configurations, it can be necessary or useful for a shield to be positioned and configured so that the conductors may pass through the shield for coupling to their mate.

Those skilled in the art are receptive to improvements in electromagnetic shielding.

SUMMARY OF THE INVENTION

The present invention is directed to an improved electromagnetic shield for a connector assembly. The shield is a thin metallic sheet having a reinforcement wall that supports a plurality of depending legs for extending through corresponding openings in a printed circuit board positioned thereon. The legs are adapted for mechanically retaining the shield between the terminals housed within the connector housing and the printed circuit board that may be received on the legs. The legs are also adapted for positioning the circuit board with respect to the shield and for electrically coupling the shield to a conductor trace on the circuit board.

The metallic sheet defines a series of rectangular openings aligned with terminals positioned within the connector housing and with corresponding terminals on the circuit board. The metallic sheet also defines one or more holes for receiving corresponding alignment posts that are fixed to the connector housing.

The metallic sheet includes one or more ground tabs extending from the edges of the sheet and spaced to provide optimum shielding at a desired frequency range. The ground tabs are configured to cooperate with a series of recessed openings in the connector housing so as to provide electrical grounding to the housing, resistance to rotation about alignment posts, and the retention within the housing.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
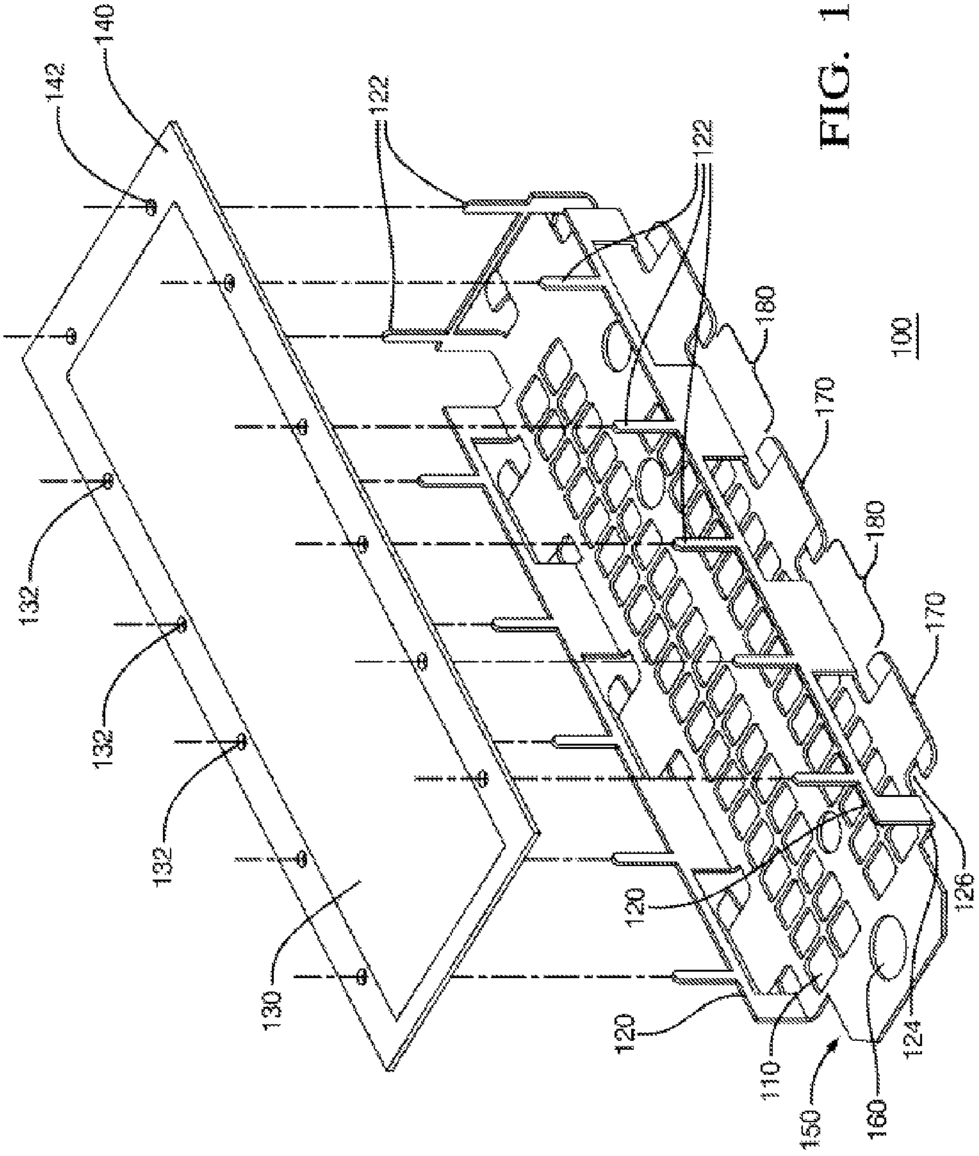
FIG. 1 is an isometric top view of an exemplary embodiment of an electromagnetic shield according to invention.

Referring now to the Figures, where the invention will be described with reference to specific embodiments, without limiting same, FIG. 1 is an isometric top view of an exemplary embodiment of an electromagnetic shield according to invention Referring to the drawings, and particularly to FIG. 1, the reference numeral 100 generally designates an electromagnetic shield according to the present invention. In an exemplary embodiment, shield 100 is formed of conductive sheet material, such as metal, with a top side 110 and depending reinforcement sidewalls 120. In accordance with this embodiment, shield 100 is designed for mechanical attachment to circuit board 130 for the purpose of shielding electronic components (not shown) mounted on circuit board 130 within an area bounded by ground conductor 140.

Mechanical attachment of shield 100 to the circuit board 130 is achieved by providing shield 100 with a plurality of sidewall legs 122 depending from reinforcement sidewalls 120 and distributed about a periphery 124 of sheet 100. Legs 122 extend from reinforcing sidewalls 120 in a direction away from top side 110 and protrude through corresponding slot openings 132 in circuit board 130 when circuit board 130 is positioned over shield 100. As one skilled in the art will appreciate, legs 122 may include reinforcement where supported by sidewalls 120. Slot openings 132 overlap the ground conductor 140 and provide means for electrically coupling ground conductor 140 and sidewall legs 122, which are electrically coupled with shield 100. In an exemplary embodiment, legs 122 are adapted for mechanically retaining printed circuit board 130 with respect to openings 150 defined by shield 100. Legs 122 may be specially adapted for electrically coupling shield 100 to a conductor trace on circuit board 130. For example, sidewall legs 122 may be adapted to provide a mechanical press fit so as to be compressed against trace 140 at the edge 142 of slot openings 132. As one skilled in the art will appreciate, legs 122 can be positioned so as to provide proper alignment of circuit board 130 with openings 150 and with terminals positioned within connector 110. Alternatively, legs 122 may be adapted to be soldered directly to trace 140.

As shown in FIG. 1, in an exemplary embodiment, shield 100 defines a series of rectangular openings 150 that are configured to permit access to terminals (not shown) that may be positioned adjacent shield 100. As one skilled in the art will appreciate, rectangular shield openings 150 can be effective to maximize clearance around terminal connectors while providing for a robust assembly process. Shield 100 also defines one or more holes 260 for receiving corresponding alignment posts (not shown). Shield 100 includes one or more ground tabs 170 extending from edges 126 of shield 100. As one skilled in the art will appreciate, spaces 180 between adjacent ground tabs 170 may be configured so as to provide optimum shielding at a desired frequency range. As one skilled in the art will appreciate, the combination of legs 122, with their capability of being electrically coupled to a mating circuit board, and ground tabs 170, with their capability of being electrically coupled to connector housing 110, enable shield 100 to provide a ground path directly from circuit board 130 to connector housing 110. As a result, shield 100 provides an improved grounding system for applications such as high frequency applications or for controller circuit boards employing bypass capacitors.

Figure 2:
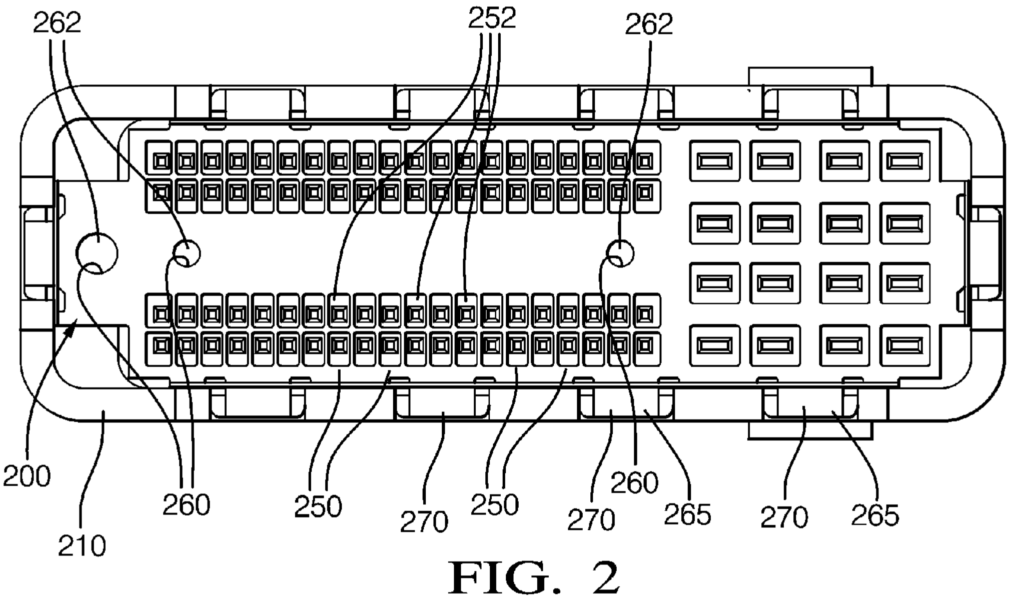
FIG. 2 is a top view of the electromagnetic shield of FIG. 1 mated with a complementary connector housing.

FIG. 2 shows an exemplary electromagnetic shield 200 mated with a complementary connector housing 210. As shown in FIG. 2, in an exemplary embodiment, shield 200 defines a series of rectangular openings 250 that are aligned with terminals 252 positioned within connector housing 210. Shield 200 also defines one or more holes 260 for receiving corresponding alignment posts 262 that are fixed to the connector housing 210. Alignment provided by cooperation between post 262, and hole 260 can be effective to provide electromagnetic isolation between shield 200 and terminals housed in connector 210. Shield 200 includes one or more ground tabs 270 configured to cooperate with a series of recessed openings 265 in connector housing 210 so as to provide electrical grounding to housing 210, resistance to rotation about alignment posts 262, and retention within housing 210.

Figure 3:
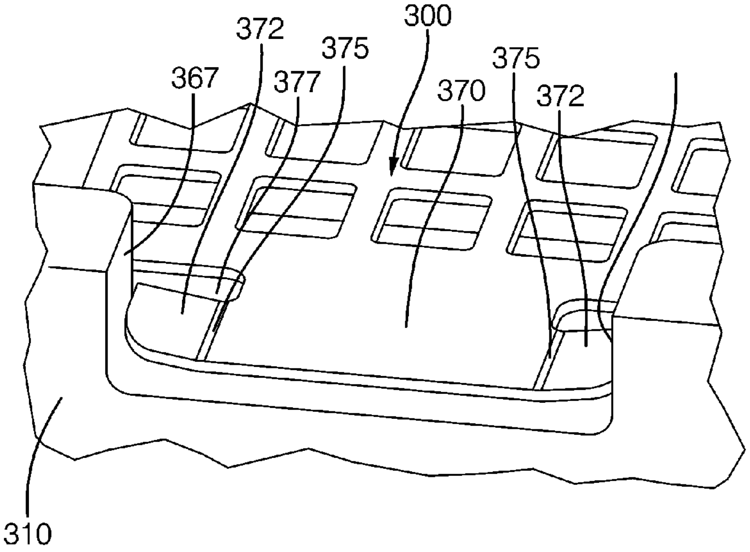
FIG. 3 is an exploded view of a grounding retention tab of the electromagnetic shield of FIG. 1.

FIG. 3 shows an exemplary ground tab 370 of an exemplary electromagnetic shield 300 mated with a complementary connector housing 310. As shown in FIG. 3, in an exemplary embodiment, ground tab 370 provides a high normal force electrical connection between ground shield 300 and connector housing 310 through compression of ground tab 370. In an exemplary embodiment, ground tab 370 is configured to provide effective grounding through its inclusion of one or more ground tab wings 372 that deform as shield 300 is nested into connector housing 310 and ground tab 370 is pressed into recessed opening 365 in connector housing 310, causing ground tab wings 372 to press against interior walls 367 of recessed opening 365. In an exemplary embodiment, ground tab 370 includes one or more stress concentration region 375, and dimensions of ground tab 370 and the position of stress concentration region 375 are defined such that ground tab wings 372 contact interior walls 367 at an optimum contact angle 377. As one skilled in the art will appreciate, an optimum contact angle 377 is configured to provide for adequate retention of ground tab 370 within recessed opening 365 while also providing effective grounding, yet requiring minimal force to press ground tab 370 into recessed opening 365. As a result, ground tab 370 deforms so as to produce a concave structure as viewed from above when pressed into recessed opening 365. In an exemplary embodiment, an optimum contact angle 377 is approximately between 10 degrees and 45 degrees. In an exemplary embodiment, ground tab 370 includes four stress concentration regions 375.

Figure 4:
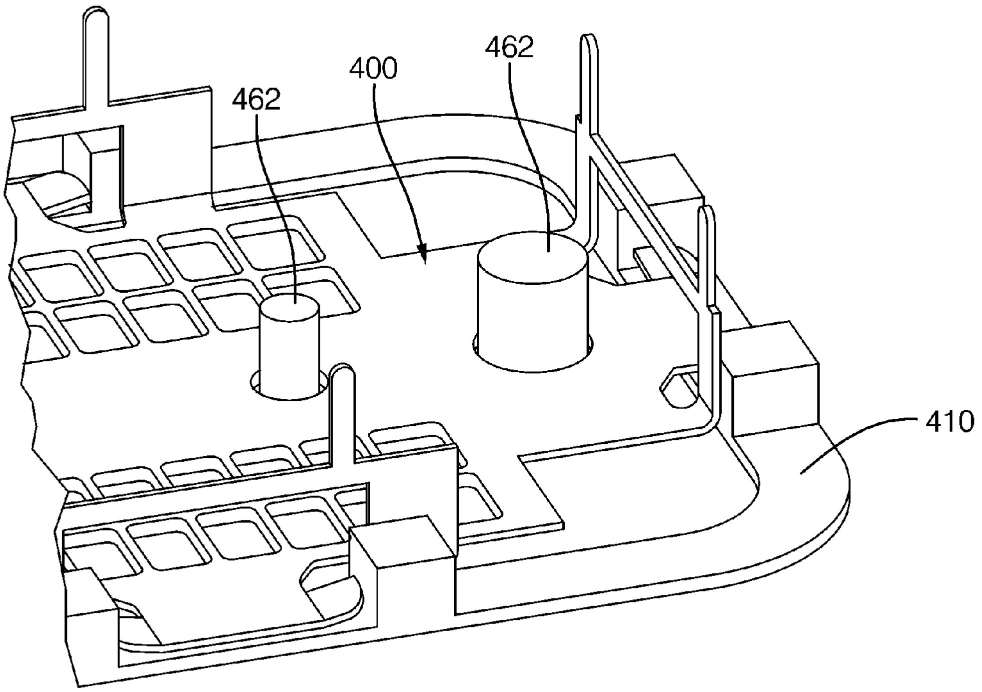
FIG. 4 is an exploded view of an exemplary position assurance feature of the electromagnetic shield of FIG. 1.

FIG. 4 shows an exploded view of an exemplary electromagnetic shield 400 mated with a complementary connector housing 410. As shown in FIG. 4, in an exemplary embodiment, shield 400 defines one or more holes 460 for receiving corresponding alignment posts 462 that are fixed to the connector housing 410.

Figure 5:
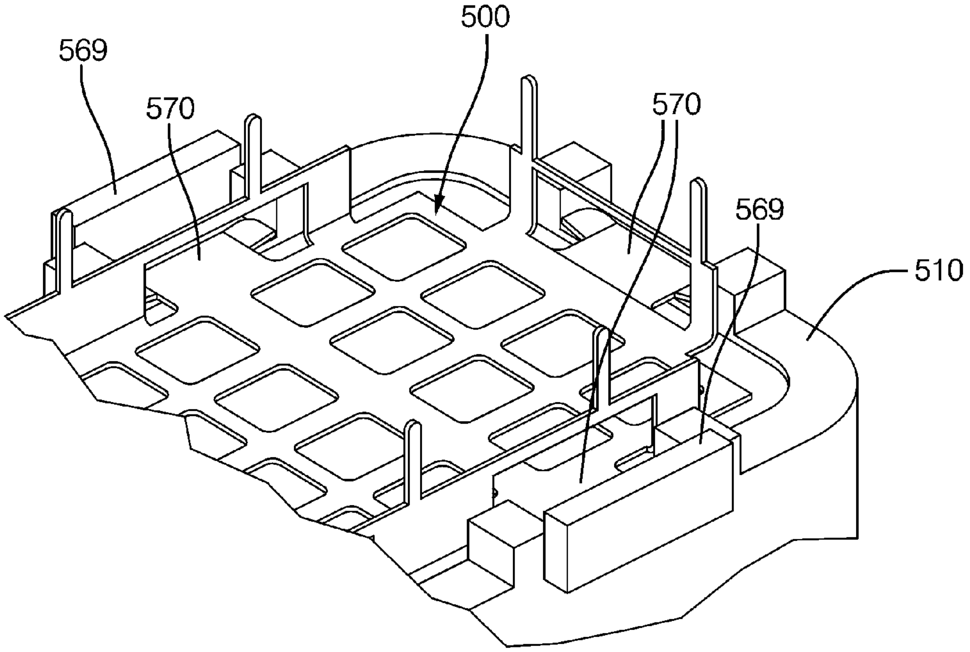
FIG. 5 is an exploded view of an exemplary position assurance feature of the electromagnetic shield of FIG. 1.
Figure 6:
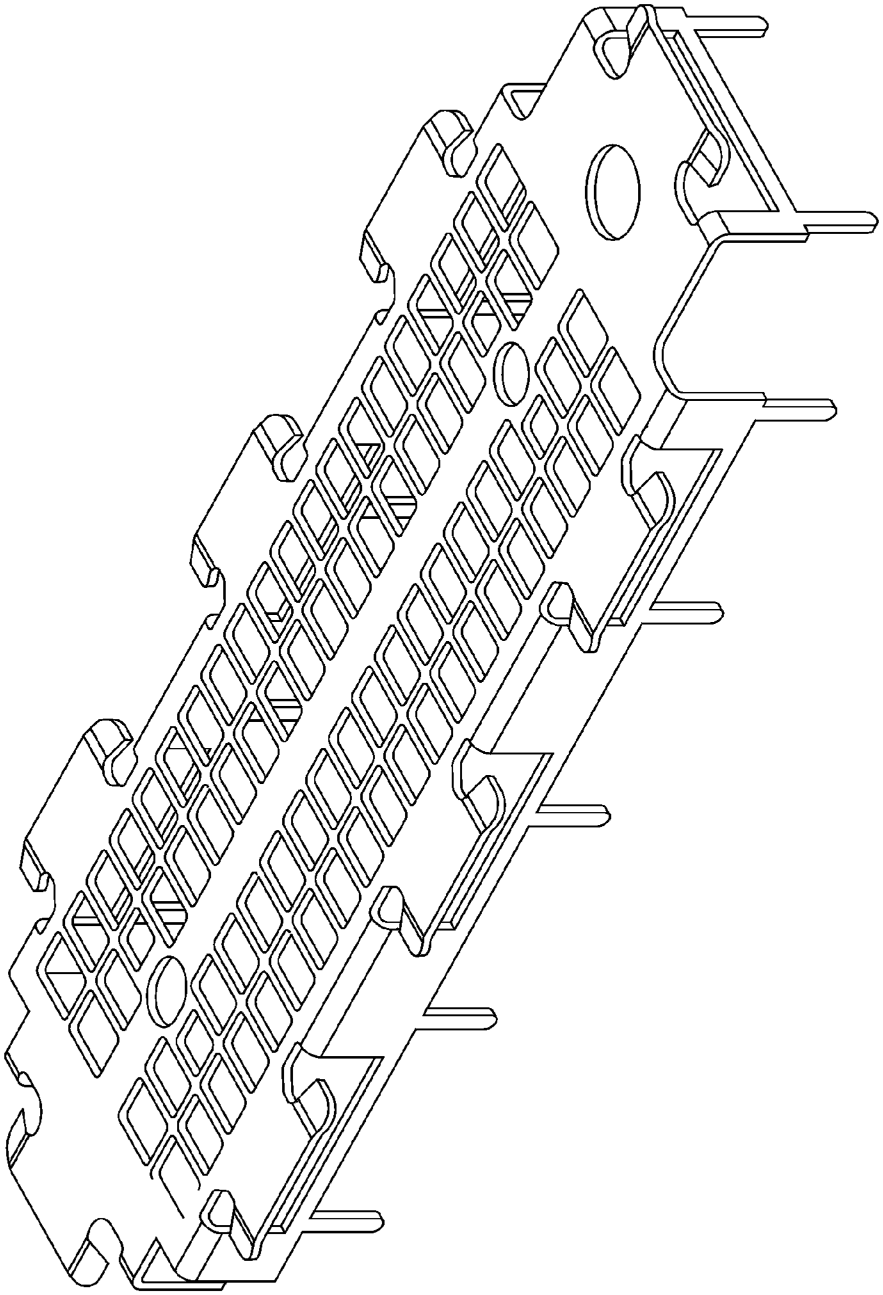
FIG. 6 is a FIG. 1 is an isometric view of an exemplary embodiment of an electromagnetic shield according to invention.

FIG. 5 shows an exploded view of an exemplary electromagnetic shield 500 mated with a complementary connector housing 510. As shown in FIG. 5, in an exemplary embodiment, shield 500 includes one or more ground tabs 570 configured to cooperate with corresponding walls 569 so as to provide resistance to rotation relative to housing 510 and retention within housing 510.

In summary, the present invention provides a one-piece electromagnetic shield 100 that is capable of being mechanically retained by, and electrically coupled to, a connector housing 110 and that is also capable of mechanically retaining a circuit board 130 so as to provide a reliable electrical continuity between the connector housing 110 and the circuit board 130. Accordingly, the circuit board 130 may be installed after the connector and an attached wiring harness have been assembled and may also be removed without difficulty for rework of the circuit board or its components if necessary.

While the electromagnetic shield of this invention has been described in detail in connection with only a limited number of embodiments, it should be understood that the invention is not limited to such disclosed embodiments and that various modifications in addition to those mentioned above will occur to persons skilled in the art. For example, the number and position of legs 122 and tabs 170 may be different than shown herein, and so forth. Additionally, while various embodiments of the invention have been described, it is to be understood that aspects of the invention may include only some of the described embodiments. Accordingly, the invention is not to be seen as limited by the foregoing description, but that it have the full scope permitted by the language of the following claims.

Having thus described the invention, it is claimed:

1. A connector comprising:

a connector housing defining a recessed opening;

a circuit board disposed within the connector housing; and an electromagnetic shield formed of conductive material, wherein the shield has a conductive sidewall defining a plurality of conductive sidewall legs distributed about a periphery of the shield and extending from the sidewall and electrically and mechanically connected to said circuit board, wherein the shield defines at least one conductive ground tab extending from an edge of the shield and perpendicular to the conductive sidewall, wherein the conductive ground tab defines a ground tab wing at two ends thereof that deforms when the ground tab is nested into the recessed opening causing the ground tab wings to press against at least two interior walls of the recessed opening so as to provide a high normal force electrical and mechanical connection between the shield and the connector housing such that the shield provides a ground path directly from circuit board to a connector housing.

2. A connector as in claim 1, wherein the shield defines a rectangular opening.

3. A connector as in claim 1, wherein the shield has at least two conductive ground tabs extending from the edge of the shield, the at least two conductive ground tabs being spaced so as to provide optimum electromagnetic shielding at a desired frequency range.

4. A connector as in claim 1, wherein the conductive ground tab includes a stress concentration region.

5. A connector as in claim 1, wherein a dimension of the conductive ground tab and a position of stress concentration region are defined such that the one or more ground tab wings contact an interior wall of the recessed opening at a contact angle between 10 degrees and 45 degrees.

6. A connector as in claim 1, wherein a contact angle between the one or more ground tab wings and an interior wall of the recessed opening is configured to provide for adequate retention of ground tab within the recessed opening while also providing effective grounding, yet requiring minimal force to press the conductive ground tab into the recessed opening.

7. A connector as in claim 1, wherein the conductive ground tab deforms so as to produce a concave structure as viewed from above when pressed into the recessed opening.

8. A connector as in claim 1, wherein the plurality of conductive depending sidewall legs is configured to protrude through corresponding slot openings in circuit board when circuit board is positioned over the shield.

9. A connector as in claim 1, wherein the plurality of conductive depending sidewall legs is electrically coupled to the shield.

* * * * *